United States Patent [19]

Dumas

[11] 3,795,045

[45] Mar. 5, 1974

[54] METHOD OF FABRICATING SEMICONDUCTOR DEVICES TO FACILITATE EARLY ELECTRICAL TESTING

[75] Inventor: Guy Dumas, Paris, France

[73] Assignee: Silec-Semi-Conducteurs, Paris, France

[22] Filed: Feb. 11, 1971

[21] Appl. No.: 114,452

[30] Foreign Application Priority Data

Aug. 4, 1970 France .............................. 70.28767

[52] U.S. Cl......................... 29/574, 29/580, 29/583, 29/588, 29/578

[51] Int. Cl.............................................. B01j 17/00

[58] Field of Search... 29/580, 583, 574, 588, 576 IW; 156/17, 345; 425/811; 117/406

[56] References Cited

UNITED STATES PATENTS

| | | | |
|---|---|---|---|
| 2,784,479 | 3/1957 | Roberts | 29/583 |
| 3,432,919 | 3/1969 | Rosvold | 29/580 |
| 3,579,815 | 5/1971 | Gentry | 29/580 |
| 3,178,796 | 4/1965 | Smits | 29/574 |
| 3,158,788 | 11/1964 | Last | 29/580 |
| 3,383,255 | 5/1968 | Rossi et al. | 156/17 |
| 3,629,023 | 12/1971 | Strehlow | 156/17 |
| 3,706,129 | 12/1972 | McCann | 29/588 |

*Primary Examiner*—Roy Lake
*Assistant Examiner*—W. C. Tupman
*Attorney, Agent, or Firm*—Sughrue, Rothwell, Mion, Zinn & Macpeak

[57] ABSTRACT

A method of fabricating semiconductor devices to facilitate electrical testing at an early stage and before final assembly to heat sinks and the like. A metallic layer is deposited over one surface of a semiconductor wafer having a previously formed internal junction or junctions. The other surface of the wafer is then coated with a chemically impervious protective layer in a grid pattern, and the exposed semiconductive material is chemically cut down to the metallic layer to form islands of junction devices separated by grooves. The grooves are next filled with a protective substance to cover the exposed junctions and the devices are electrically tested. The devices are then separated by mechanically cutting through the grooves and metallic layer, and the acceptable ones are mounted on their final supports or heat sinks.

3 Claims, 6 Drawing Figures

INVENTOR
GUY H. DUMAS

BY Sughrue, Rothwell, Mion, Zinn & Macpeak
ATTORNEYS

METHOD OF FABRICATING SEMICONDUCTOR DEVICES TO FACILITATE EARLY ELECTRICAL TESTING

BACKGROUND OF THE INVENTION

1. Field of the Invention

This invention relates to a method for cutting semiconductor devices, and more particularly, to a method for obtaining active, protected semiconductor devices by grooving a small plate of semiconductor material which has undergone the treatment cycles designed to furnish active element devices.

Description of the Prior Art

One of the many methods known for the production of semiconductor devices consists in cutting a small plate up into elementary devices, said plate having, prior to cutting, gone through the treatment cycles designed to create active devices.

One of the known methods used for cutting a small plate consists in covering it with a protection mask consisting of a coating that will not be sensitive to chemical agents used to attack the semiconductor material of the plate. This coating is applied by means of a grid so as to cover only the desired places of the semiconductor devices, and to leave, between the latter, some exposed areas which alone will be attacked by said chemical agents, thus forming grooves which separate the elementary semiconductor devices obtained from each other. These devices, thus cut, are then cleaned and after that they are soldered on a support. After that, each device is subjected to a cleaning operation. It is then coated with a protective product designed to protect the junction or junctions and finally its electrical characteristics are checked before enclosing it in a tight box.

Although this known method is widely used in practice, it involves the disadvantage of not permitting the checking of the electrical characteristics of the semiconductor devices obtained until after each one of them has been soldered on a support and coated with a protective covering. This increases the cost of the devices and reduces the yield, since all of the devices, be they good or defective, must undergo soldering and protection operations.

SUMMARY OF THE INVENTION

It is consequently one of the main objectives of this invention to eliminate this disadvantage by permitting the checking of the electrical characteristics of each one of the active and protected semiconductor devices obtained before their soldering upon a support, thus to save soldering time as well as the cost connected with this and the cost of the support corresponding to each semiconductor device which is found to be defective, and by the same token, to reduce the cost of the series of devices treated.

A related purpose of this invention is to provide a process for cutting semiconductor devices from a small plate by etching in groups to provide protection for the active elements obtained, as well as to test them electrically due to the fact that they are insulated from each other and protected.

To attain these objectives according to this invention, a support metal layer is deposited on one face of the treated plate which is made of semiconductor material and which is to be cut. This layer can, for example, be gold or silver, the latter being preferred because of its low cost and its technical qualities. On the plate the known process of chemical cutting which is described earlier is then carried out. Care is taken, however, to direct the chemical attack in such a way that the plate will be cut only into active elements, without reaching said support metal layer, which according to the invention, is designed to keep the cut devices together in a group. The chemical attack is conducted in a turning cup so as to obtain cuts that will be more regular than those obtained by chemical cutting in a static bath. The cut plate with its metal support is then etched and the grooves cut into the plate are filled with a material designed to protect the lateral parts of each of the elementary devices, where the junction or junctions are exposed. To perform this protection operation, the cut plate, with its metal support layer, is placed in a vacuum on a mobile support and the protective substance is applied to the grooves. This substance, for example may be silicon-polymer base resin. According to the method involved in this invention, the protective substance is applied under pressure through the holes of a grid. These holes are distributed according to a pattern identical to the one used in the chemical cutting. Each of these holes is situated opposite an intersection between the grooves on the cut plate. The protective substance is distributed so that each groove will be filled completely and no lateral edge of any of the elementary devices remains uncovered. The electric test is then preferably performed before the cutting of the support metal layer. Each elementary device may be tested electrically since it is electrically insulated from its neighbors and since it is protected. If it is found to be good, it can be soldered on a support and enclosed in a tight box after the metal support layer has been cut as well as after the protective separations have been made in the grooves, so as to loosen the protected elementary devices. This operation may be performed, for example, by means of a tool of the "razor blade," "slicer," or "wheel" type.

The method involved in this invention, for the purpose of obtaining active and protected semiconductor devices from a small plate made of semiconductor material that has first been treated so as to make active the elementary devices which will be cut into it, includes the following steps: the deposit, first of all, of a support metal layer on one face of the plate, the subsequent coating of the other face of the plate with a coating that is not sensitive to chemical grooving agents and that is distributed so as to cover only the surface of the desired elementary semiconductor elements by creating intervals between them where the semiconductor material of the plate is exposed, subjecting the plate thus obtained, along with its support metal and its coating, to a chemical bath selected to attack only the semiconductor material and continuing the chemical attack or cutting operation until it reaches down to the level of the metal support plate, but without attacking the latter. The group of cut-up semiconductor devices, which are still held on the metal support layer are then etched. After that the grooves between the devices are filled with a protective substance selected to spread into the grooves so that none of the lateral or exposed side portions of any of the elementary devices remain uncovered. The electrical characteristics of these elementary devices are then tested. Finally, the metal support layer as well as the protective substance is cut along the axes of the filled grooves to separate the active element devices which can then be soldered on a support.

DESCRIPTION OF THE PREFERRED EMBODIMENT

Figure 4:
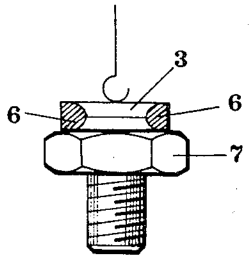
FIG. 4 is a cross-section, on a smaller scale, of the semiconductor device shown in FIG. 3, mounted on a support by soldering.
Figure 5:
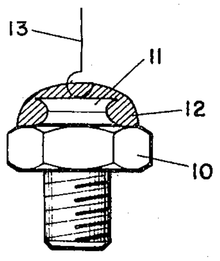
FIG. 5 is a cross-section view of a semiconductor device soldered on a support, on the same scale as the one shown in FIG. 4, but obtained according to one of the known processes of the prior state of the art.

With relation to FIGS. 1–4, one way of implementing the method of the invention to obtain a semiconductor device as shown in FIG. 4, will be described in comparison to the semiconductor device shown in FIG. 5 obtained by means of a previously known method. This known method for cutting plates of treated semiconductor material into elementary devices consists in using a protection mask constituted by a coating that is not sensitive to the chemical agents used, which covers the devices to be obtained and which leaves exposed the separations between the latter. The separations are eaten away during chemical attack. The cut and separated devices are then cleaned and soldered on a support 10. Each soldered device 11 is then cleaned and coated with a protective product 12, embedding in it an upper connection 13 to obtain the device shown in FIG. 5. Finally, its electrical characteristics are tested before enclosing it in a tight box.

This known procedure involves the disadvantage of enabling the checking of the electrical characteristics only after soldering upon a support and after a protective substance has been applied.

Figure 1:
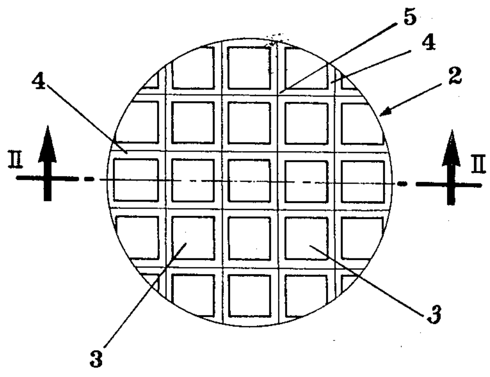
FIG. 1 is a plan view of a plate grooved according to one way of implementing the method involved in this invention.
Figure 2:
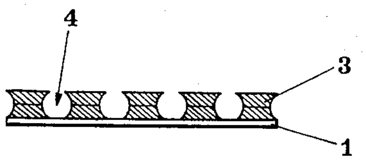
FIG. 2 is a section along II—II of the grooved plate shown in FIG. 1 in which the thickness of the support layer and the semiconductor material are on a scale larger than the one for the diameter of the plate in order better to show the shape of the grooves obtained by chemical cutting between the elementary semiconductor devices.
Figure 3:
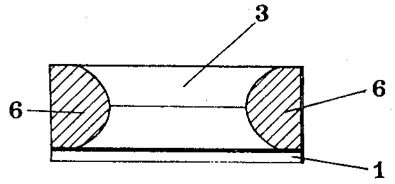
FIG. 3 is a cross-section view on a larger scale showing a semiconductor device which is active and protected and which has been obtained by the implementation of the method according to this invention.

On the other hand, in the method of this invention, a metal support layer 1, made of gold or silver, is deposited on one face of a plate 2 made of previously treated semiconductor material. This layer makes it possible, after the plate has been cut, to keep the elementary devices 3 together and in one piece. The chemical cutting process is essentially the same as the previously described known process; however, in this instance while the semiconductor material is cut over its entire thickness, the support layer 1 is not cut or eaten away, resulting in a grooved plate as shown in FIGS. 1 and 2. Furthermore, the chemical cutting operation is performed in a turning cup so as to obtain cuts which will be more regular than those obtained by the known method which employs a static chemical bath. Grooves 4 are then filled with a substance designed to protect the lateral parts of each of the elementary devices where the junction or junctions are exposed. To perform this filling operation, the plate is disposed in a vacuum on a movable support and the protective substance is applied by means of pressure through the holes of a grid having a pattern identical to that used in the chemical cutting process. The holes are opposite the intersections 5 of grooves 4, and this operation is performed so that no lateral portion of each of the elementary devices remains uncovered, while the protective substance 6 rises to the upper surface of the devices. Each group of devices is then etched, cleaned and the individual devices in the group are electrically tested. The metal support layer, as well as the protective substance 6 are next cut along the axes of the grooves by tools of the "razor blade," "slicer," or "wheel" type in order to obtain elementary devices of the type shown in FIG. 3, where the hatched parts correspond to the protective substance 6. The devices may be electrically tested in a group or individually, that is before cutting into the axes of grooves 4, or after the devices are separated from each other, but are preferably tested before the final separation cutting step. Each elementary device which is found to be good can then be soldered on a support 7 in order to obtain a semiconductor device as shown in FIG. 4 and it is then enclosed in a tight box and placed in operation.

Figure 6:
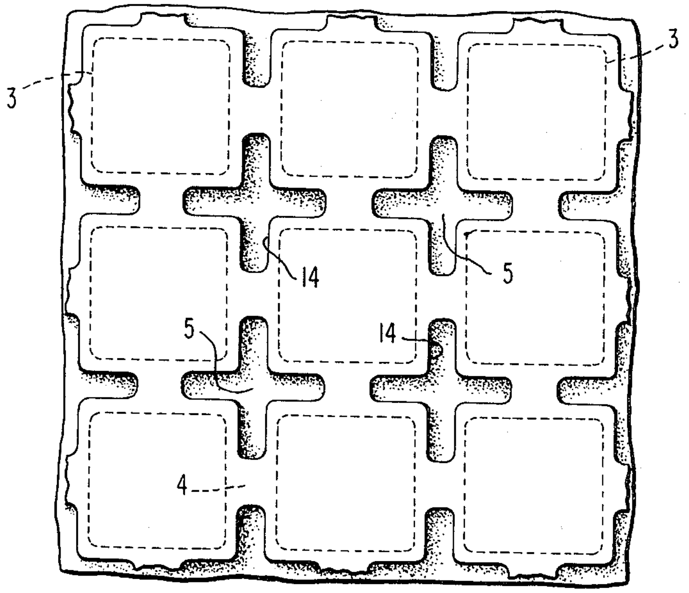
FIG. 6 is a plan view of a grid used to implement the masking and filling steps of the invention.

FIG. 6 shows a plan view of a grid used to implement the masking and filling operations described above. The grid, whose pattern corresponds to that used in the cutting process, is placed over the wafer to mask the devices 3 and the protective substance is applied under pressure through cross-shaped holes 14 to fill the grooves 4. The holes 14 are positioned above the intersections 5.

I claim:

1. A method of fabricating finished semi-conductive devices from a semiconductor wafer having an internal junction, comprising:

a. depositing a metallic support layer on one surface of the wafer, b. selectively coating one opposite surface of the wafer through a mask in a waffle pattern with a material impervious to cutting and etching chemicals subsequently to be employed, said coating being applied over the areas from which semiconductive devices are to be fabricated, c. chemically cutting grooves through the thickness of the wafer and down to the metallic layer in those areas that were not selectively coated, thereby forming islands of semiconductor devices supported on the metallic layer and separated by intersecting lines of grooves, d. filling the grooves between the islands with a protective substance to cover the exposed junctions in the sides of the devices by placing a mask having holes opposite each groove line intersection over the semiconductor device and applying pressure to the protective substance to force it through the holes into the grooves, and e. mechanically cutting down the middle of the grooves through the protective substance and the metallic layer to separate the semiconductive devices from each other.

2. A method as defined in claim 1, further including the step of electrically testing each semiconductor device while it is laterally insulated from adjacent devices by the protective substance applied in subparagraph (d) and before it is separated from the adjacent devices by the mechanical cutting recited in sub-paragraph e).

3. A method as defined in claim 2, wherein the testing is implemented by applying a first test electrode to the metallic support layer and then successively applying a second test electrode to the top part of each semiconductor device.

* * * * *